US012765232B2

(12) United States Patent
Kim et al.

(10) Patent No.: US 12,765,232 B2
(45) Date of Patent: Oct. 13, 2026

(54) DISPLAY APPARATUS AND METHOD OF MANUFACTURING THE SAME

(71) Applicant: Samsung Display Co., LTD., Yongin-si (KR)

(72) Inventors: Boyun Kim, Yongin-si (KR); Sungwoo Eo, Yongin-si (KR); Jiyun Jung, Yongin-si (KR); Sungwon Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 384 days.

(21) Appl. No.: 18/368,966

(22) Filed: Sep. 15, 2023

(65) Prior Publication Data

US 2024/0099106 A1 Mar. 21, 2024

(30) Foreign Application Priority Data

Sep. 20, 2022 (KR) ........................ 10-2022-0118818

(51) Int. Cl.

*H10W 10/17* (2026.01)
*H10K 59/12* (2023.01)
*H10K 59/80* (2023.01)

(52) U.S. Cl.

CPC ....... *H10K 59/873* (2023.02); *H10K 59/1201* (2023.02)

(58) Field of Classification Search

CPC .. H10K 59/873; H10K 59/1201; H10K 71/80; H10K 71/00; H10K 50/841

USPC .......................................................... 257/680

See application file for complete search history.

(56) References Cited

U.S. PATENT DOCUMENTS

| | | | |
|---|---|---|---|
| 11,161,323 B2 | 11/2021 | Choi et al. | |
| 11,721,244 B2 | 8/2023 | Chun et al. | |
| 2016/0209550 A1 | 7/2016 | Jeong et al. | |
| 2019/0006620 A1 | 1/2019 | Kim et al. | |
| 2022/0059796 A1* | 2/2022 | Kim | H10K 59/87 |

FOREIGN PATENT DOCUMENTS

| | | |
|---|---|---|
| KR | 1020160088524 A | 7/2016 |
| KR | 101806038 B1 | 12/2017 |
| KR | 20180083171 A | 7/2018 |
| KR | 20190001867 A | 1/2019 |
| KR | 20190045014 A | 5/2019 |
| KR | 1020200025851 A | 3/2020 |
| KR | 1020200049942 A | 5/2020 |
| KR | 1020210010168 A | 1/2021 |
| KR | 20210085194 A | 7/2021 |

* cited by examiner

*Primary Examiner* — Theresa T Doan

(74) *Attorney, Agent, or Firm* — CANTOR COLBURN LLP

(57) ABSTRACT

A method of manufacturing a display apparatus includes: preparing a window, where the window includes a rear protection film, a window substrate, a front protection film, and a carrier film; removing the rear protection film and attaching a lower structure of the display apparatus to the window substrate; and removing the carrier protection film.

14 Claims, 11 Drawing Sheets

DISPLAY APPARATUS AND METHOD OF MANUFACTURING THE SAME

This application claims priority to Korean Patent Application No. 10-2022-0118818, filed on Sep. 20, 2022, and all the benefits accruing therefrom under 35 U.S.C. § 119, the content of which in its entirety is herein incorporated by reference.

BACKGROUND

1. Field

The disclosure relates to a display apparatus and a method of manufacturing the display apparatus.

2. Description of the Related Art

Recently, display apparatuses are widely used in various fields. In addition, because the thicknesses of display apparatuses are reduced and the weights of display apparatuses are reduced, the scope of the use thereof is increasing.

As the display apparatus is widely used in various fields, various methods for designing the shape of the display apparatus can be provided. In addition, various functions that combine or associate with the display apparatus are increasing.

SUMMARY

One or more embodiments include a display apparatus, where a window used in a method of manufacturing the display apparatus is provided to have a double protection film structure so that the surfaces of other layers of the window other than the protection film are not exposed during a manufacturing process and thus the surfaces of the layers of the window may be effectively prevented from being damaged. However, these objectives are exemplary, and the scope of the disclosure is not limited thereby.

According to one or more embodiments, a method of manufacturing a display apparatus includes preparing a window, where the window includes a rear protection film, a window substrate, a front protection film, and a carrier protection film, removing the rear protection film and attaching a lower structure of the display apparatus to the window substrate, and removing the carrier protection film.

In an embodiment, the front protection film may include a first adhesive layer and a first base film.

In an embodiment, the front protection film may further include at least one selected from a first antistatic layer and a second antistatic layer.

In an embodiment, a thickness of the first base film may be in a range of about 70 micrometers (μm) to about 130 μm.

In an embodiment, a release force of the front protection film may be in a range of about 12 gram-force per inch (g·f/inch) to about 30 g·f/inch.

In an embodiment, a surface resistance of the front protection film may be in a range of about $10^5$ Ohm per square (Ω/sq) to about $10^{11}$ Ω/sq.

In an embodiment, the window may further include a second adhesive layer, a film layer, and a hard coating layer, which are arranged between the window substrate and the front protection film.

In an embodiment, the first adhesive layer may be attached to the hard coating layer.

In an embodiment, the carrier protection film may include a third adhesive layer and a second base film.

In an embodiment, the carrier protection film may further include at least one selected from a third antistatic layer and a fourth antistatic layer.

In an embodiment, a thickness of the second base film may be in a range of about 35 μm to about 65 μm.

In an embodiment, a thickness of the third adhesive layer may be in a range of about 10 μm to about 20 μm.

In an embodiment, a release force of the carrier protection film may be in a range of about 5 g·f/inch to about 15 g·f/inch.

In an embodiment, a surface resistance of the carrier protection film may be in a range of about $10^5$ Ω/sq to about $10^{11}$ Ω/sq.

According to one or more embodiments, a display apparatus includes a lower structure and a window arranged on the lower structure and including a window substrate and a front protection film, where the front protection film includes a first adhesive layer and a first base film.

In an embodiment, a thickness of the first base film may be in a range of about 70 μm to about 130 μm.

In an embodiment, a release force of the front protection film may be in a range of about 12 g·f/inch to about 30 g·f/inch.

In an embodiment, a surface resistance of the front protection film may be in a range of about $10^5$ Ω/sq to about $10^{11}$ Ω/sq.

In an embodiment, the window may further include a second adhesive layer, a film layer, and a hard coating layer, which are arranged between the window substrate and the front protection film.

In an embodiment, the front protection film may further include at least one selected from a first antistatic layer and a second antistatic layer.

Features of embodiments of the invention other than those described above may be apparent from the following drawings, the claims, and the detailed description of the disclosure.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
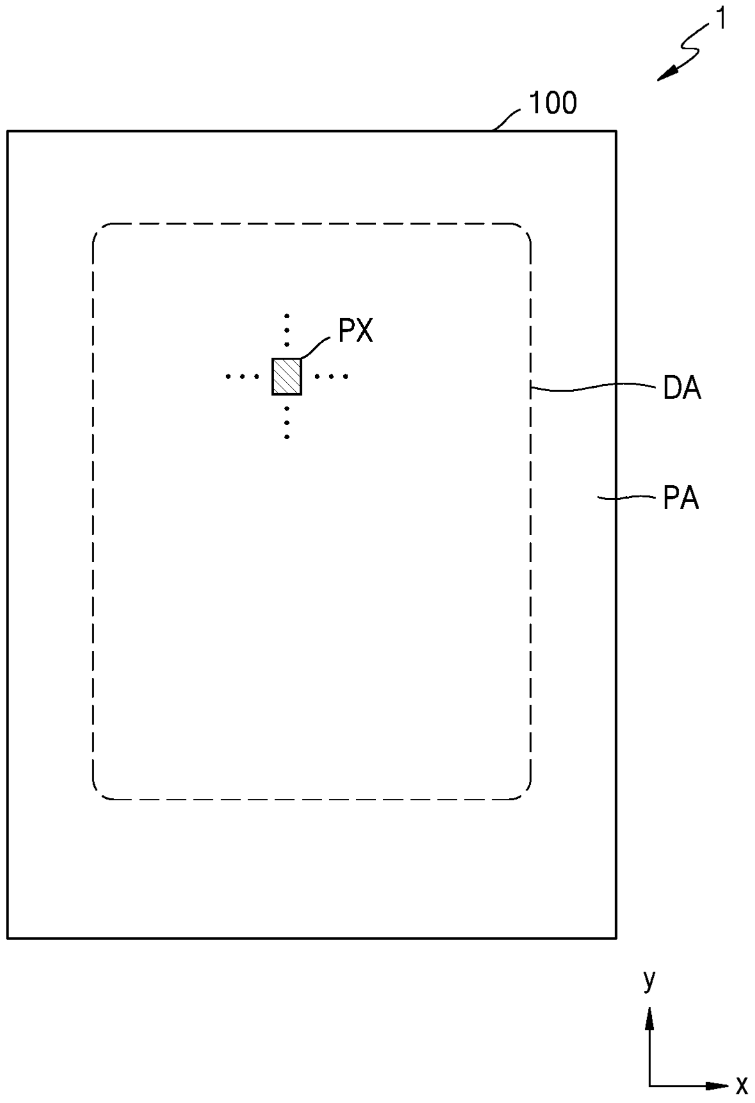
FIG. 1 is a plan view schematically illustrating a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Throughout the disclosure, the expression "at least one of a, b or c" indicates only a, only b, only c, both a and b, both a and c, both b and c, all of a, b, and c, or variations thereof.

Since various modifications and various embodiments of the disclosure are possible, specific embodiments are illustrated in the drawings and described in detail in the detailed description. Effects and features of the disclosure, and a method of achieving them will be apparent with reference to embodiments described below in detail in conjunction with the drawings. However, the disclosure is not limited to the embodiments disclosed herein, but may be implemented in a variety of forms.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. In the specification, "A and/or B" is A, B, or A and B. Throughout the disclosure, the expression "at least one selected from a, b and c", "at least one of a, b or c", or ""at least one of a, b and c" indicates only a, only b, only c, both a and b, both a and c, both b and c, all of a, b, and c, or variations thereof.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present.

In the drawings, for convenience of explanation, the sizes of components may be exaggerated or reduced. For example, since the size and thickness of each component shown in the drawings are arbitrarily indicated for convenience of illustration and description, the disclosure is not necessarily limited to the illustration.

In the following embodiments, the meaning that a wiring "extends in a first direction or a second direction," includes not only extending in a straight line shape, but also extending in a zigzag or curved line along the first direction or the second direction.

In the following embodiments, when referred to as a "planar," it means when a target portion is viewed from above, and when referred to as a "cross-sectional view," it means when a cross section of the target portion cut vertically is viewed from a side. In the following embodiments, "overlap" includes "planar" and "cross-sectional" overlap.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings, and the same or corresponding components will be denoted by the same reference numerals when described with reference to the drawings.

FIG. 1 is a plan view schematically illustrating a display apparatus according to an embodiment.

Referring to FIG. 1, an embodiment of a display apparatus 1 may include a display area DA in which an image is displayed, and a peripheral area PA around the display area DA. The display apparatus 1 may provide an image to the outside by using light emitted from the display area DA. In an embodiment, the display apparatus 1 may include a substrate 100, where the substrate 100 may be divided into the display area DA and the peripheral area PA or the display area DA and the peripheral area PA may be defined on the substrate 100.

The substrate 100 may include various materials, such as glass, metal or plastic, or the like. In an embodiment, the substrate 100 may include a flexible material. Here, the flexible material may be a material which is flexible and bent and foldable or rollable. The flexible substrate 100 may include or be made of ultra-thin glass, metal, or plastic.

Pixels PX including a light-emitting device, such as an organic light-emitting diode, may be arranged in the display area DA of the substrate 100. The pixels PX may include a plurality of pixels, and the plurality of pixels PX may be arranged in various forms, such as a stripe arrangement, a pentile arrangement, a mosaic arrangement, and the like. Hereinafter, the display apparatus 1 according to an embodiment includes a light-emitting device, and the light-emitting device is an organic light-emitting diode. However, embodiments are not limited thereto. In an alternative embodiment, for example, the light-emitting device may be an inorganic light-emitting diode, a quantum dot light-emitting diode, or the like.

In an embodiment, as shown in FIG. 1, the planar shape of the display area DA may be a rectangular shape. However, embodiments are not limited thereto. In an embodiment, for example, the display area DA may be provided in a polygonal shape, such as a triangle, a pentagon, a hexagon, or the like, a circular shape, an oval shape, an atypical shape, or the like.

The peripheral area PA of the substrate 100, which is an area around the display area DA, may be an area in which no image is displayed. Various wirings for transmitting an electrical signal to be applied to the display area DA and pads to which a printed circuit board or a driver integrated circuit (IC) chip are attached may be located in the peripheral area PA.

Figure 2:
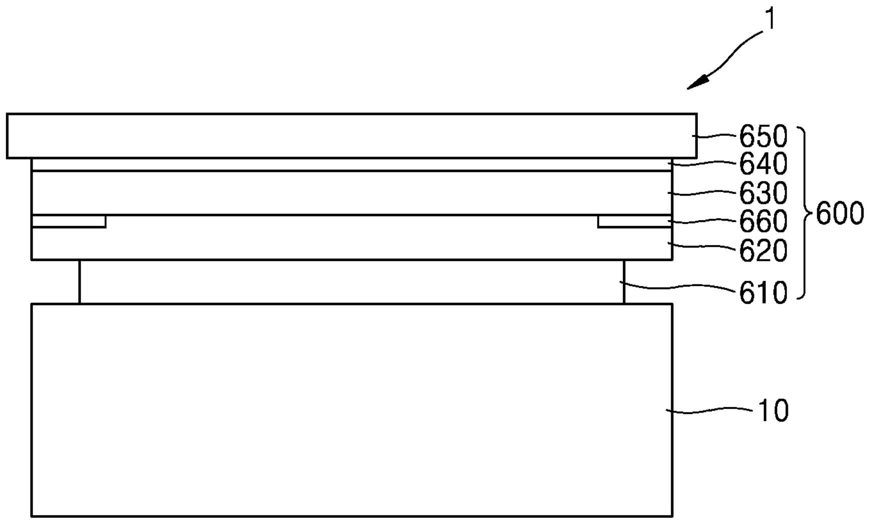
FIG. 2 is a cross-sectional view schematically illustrating a display apparatus according to an embodiment.
Figure 3A:
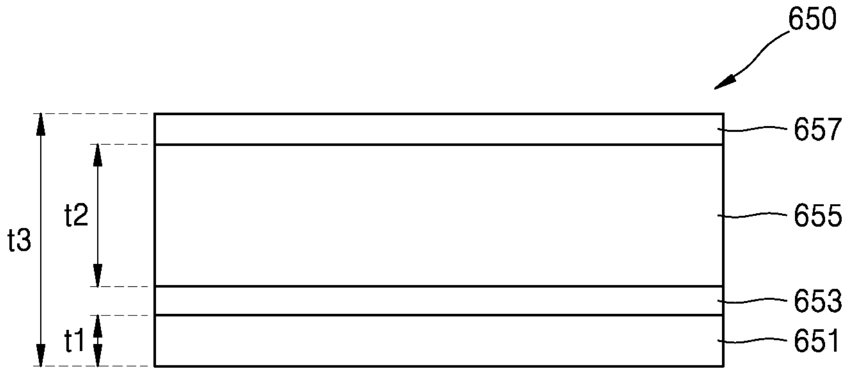
FIGS. 3A through 3D are cross-sectional views schematically illustrating a front protection film of a display apparatus according to an embodiment.
Figure 3B:
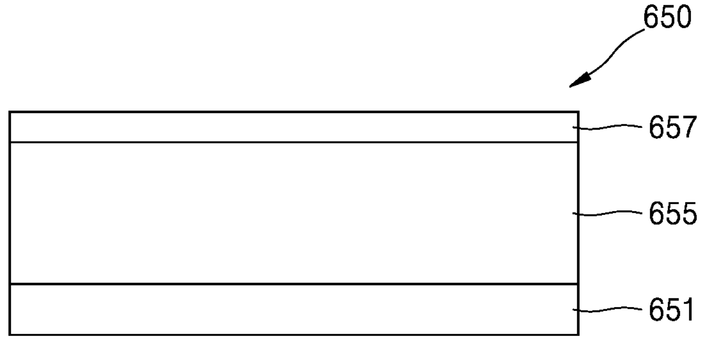
Figure 3C:
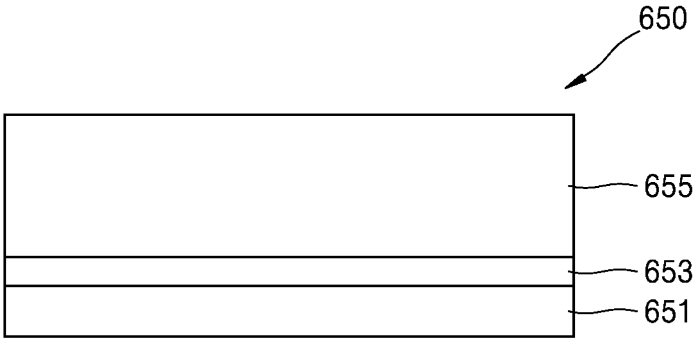
Figure 3D:
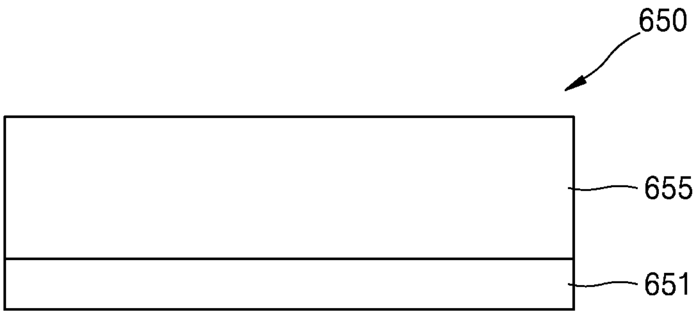
Figure 4:
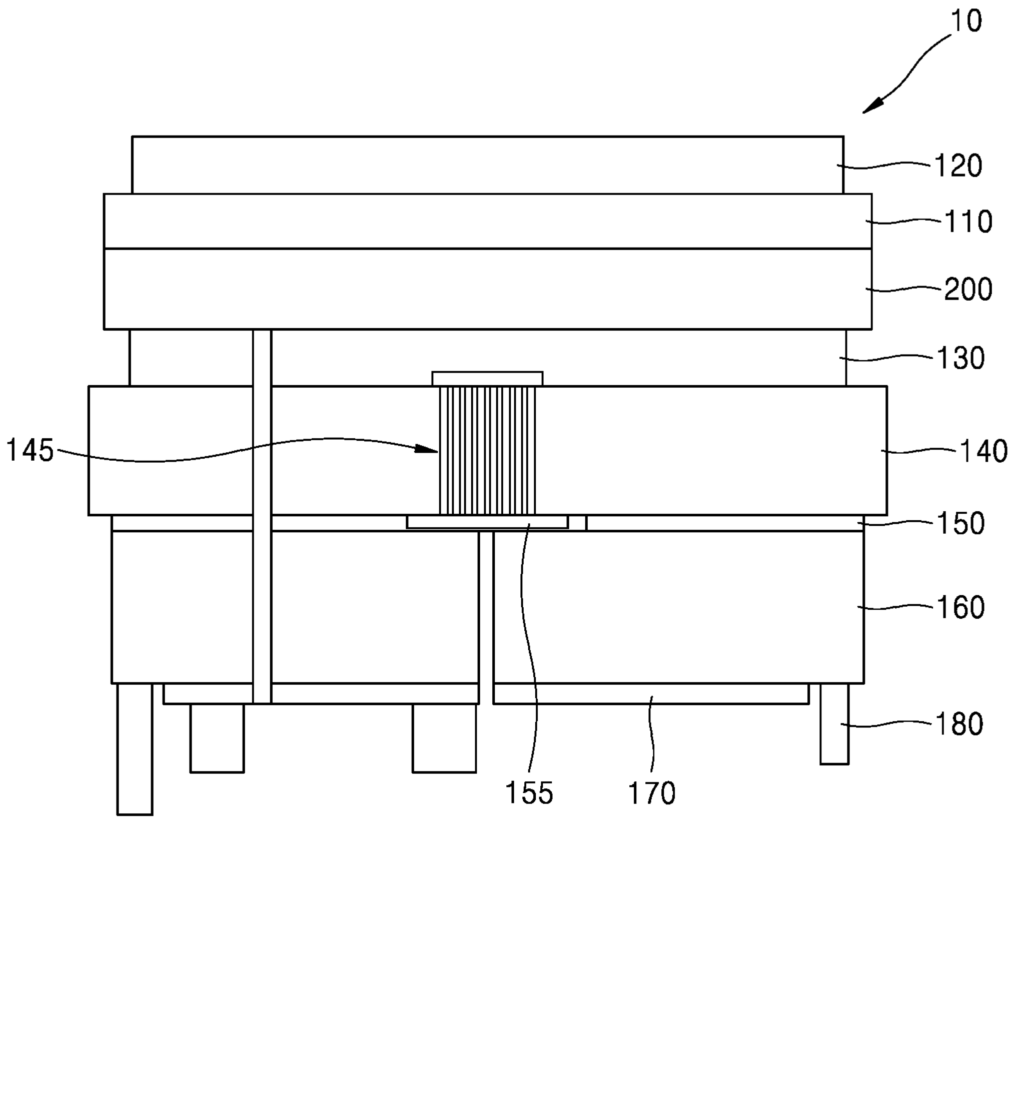
FIG. 4 is a cross-sectional view schematically illustrating a lower structure of a display apparatus according to an embodiment.

FIG. 2 is a cross-sectional view schematically illustrating a display apparatus according to an embodiment, FIGS. 3A through 3D are cross-sectional views schematically illustrating a front protection film of a display apparatus according to an embodiment, and FIG. 4 is a cross-sectional view schematically illustrating a lower structure of a display apparatus according to an embodiment.

Referring to FIGS. 2, 3A, and 4, an embodiment of the display apparatus 1 may include a lower structure 10 and a window 600. In an embodiment, the window 600 may include a window substrate 610, a second adhesive layer 620, a film layer 630, a hard coating layer 640, a front protection film 650, and an opaque layer 660.

In an embodiment, the window substrate 610 may include a material, such as glass, quartz, or the like. In an embodiment, for example, the window substrate 610 may be provided as ultra-thin glass (UTG™). However, embodiments are not limited thereto. Alternatively, the window substrate 610 may include or be formed of a polymer resin. In an embodiment, for example, the window substrate 610 may include or be formed of polyethersulfone, polyacrylate, polyetherimide, polyethylene naphthalate, polyethylene terephthalate, polyphenylene sulfide, polyarylate, polyimide, polycarbonate, cellulose acetate propionate, or the like. The window substrate 610 may have a thickness in a range of about 20 micrometers (μm) to 60 μm, which is a width in a thickness direction of the window 600.

The second adhesive layer 620 may be arranged on the window substrate 610, and the film layer 630 may be arranged on the second adhesive layer 620. In an embodiment, for example, the film layer 630 may be adhered (or attached) to the window substrate 610 through the second adhesive layer 620. The film layer 630 may be arranged on the window substrate 610 so that the window substrate 610 may be protected from external shock and scratch etc. may be effectively prevented from occurring in the surface of the window substrate 610.

In an embodiment, the second adhesive layer 620 may include a pressure sensitive adhesive (PSA). In an embodiment, for example, the second adhesive layer 620 may be an acryl-based PSA. However, embodiments are not limited thereto. Alternatively, the second adhesive layer 620 may include an optically clear adhesive (OCA). The second adhesive layer 620 may be provided with a thickness of about 35 μm in the thickness direction of the window 600.

In an embodiment, the film layer 630 may include a polymer resin, such as polyethersulfone, polyacrylate, polyetherimide, polyethylene naphthalate, polyethylene terephthalate, polyphenylene sulfide, polyarylate, polyimide, polycarbonate, cellulose acetate propionate, or the like. However, embodiments are not limited thereto. In an alternative embodiment, for example, the film layer 630 may include or be formed of a material, such as glass, quartz, or the like. The film layer 630 may be provided with a thickness of about 65 μm in the thickness direction of the window 600.

In an embodiment, the hard coating layer 640 may be arranged on the film layer 630. The hard coating layer 640 may include or be formed of an organic material such as a polymer resin. However, embodiments are not limited thereto. Alternatively, the hard coating layer 640 may include or be formed of an inorganic material.

In an embodiment, the front protection film 650 may be arranged on the hard coating layer 640. The front protection film 650 may protect the hard coating layer 640 from external foreign substances or protrusions. The light transmittance of the front protection film 650 may be about 90% or more.

In an embodiment, the opaque layer 660 may be provided between the second adhesive layer 620 and the film layer 630. However, embodiments are not limited thereto. Alternatively, the opaque layer 660 may also be provided in the film layer 630 or at a portion of the film layer 630. Alternatively, the opaque layer 660 may also be provided in the second adhesive layer 620 or at a portion of the second adhesive layer 620. The opaque layer 660 may include or be formed of an opaque material so that a wiring or circuit of the display apparatus 1 may not be recognized from the outside through the opaque layer 660. A portion where the opaque layer 660 is disposed may correspond to the peripheral area (see PA of FIG. 1) described in FIG. 1. Alternatively, the portion where the opaque layer 660 is disposed, may correspond to a bezel area.

In an embodiment, as shown in FIG. 3A, the front protection film 650 may include a first adhesive layer 651, a first antistatic layer 653, a first base film 655, and a second antistatic layer 657. Alternatively, although not shown, the front protection film 650 may further include a first release film disposed under the first adhesive layer 651.

In an embodiment, the first adhesive layer 651 may include a PSA. In an embodiment, for example, the first adhesive layer 651 may be an acryl-based PSA. However, embodiments are not limited thereto. Alternatively, the first adhesive layer 651 may include an OCA. The first adhesive layer 651 may have a thickness t1 of about 10 μm or more and about 20 μm or less (i.e., a thickness t1 in a range of about 10 μm to about 20 μm) in the thickness direction of the front protection film 650 (e.g., the thickness direction of the window 600). If the thickness t1 of the first adhesive layer 651 is less than about 10 μm, an adhesive force of the first adhesive layer 651 is so small that the front protection film 650 may be peeled from the film layer 630 or the hard coating layer 640. On the other hand, if the thickness t1 of the first adhesive layer 651 exceeds about 20 μm, the release force of the front protection film 650 may be too large. Thus, in such an embodiment where the first adhesive layer 651 has the thickness t1 of about 10 μm or more and about 20 μm or less, the front protection film 650 may have a desired degree of release force.

In an embodiment, the first antistatic layer 653 may be arranged on the first adhesive layer 651. The first antistatic layer 653 may provide antistatic properties to the window 600 or the front protection film 650.

In an embodiment, the first base film 655 may be arranged on the first antistatic layer 653. The first base film 655 may include or be formed of polyethersulfone, polyacrylate, polyetherimide, polyethylene naphthalate, polyethylene terephthalate, polyphenylene sulfide, polyarylate, polyimide, polycarbonate, cellulose acetate propionate, or the like. However, embodiments are not limited thereto. In an alternative embodiment, for example, the first base film 655 may include or be formed of a material, such as glass, quartz, or the like.

In an embodiment, a thickness t2 of the first base film 655 may be about 70 μm or more and about 130 μm or less in a thickness direction of the front protection film 650 (or the thickness direction of the window 600). If the thickness t2 of the first base film 655 is less than about 70 μm, the thickness t2 of the first base film 655 may be so small that the hard coating layer 640 may be damaged by external foreign substances or protrusions. On the other hand, if the thickness t2 of the first base film 655 exceeds about 130 μm, the thickness of the front protection film 650 including the first base film 655 may be so large that optical characteristics may be deteriorated (e.g., haze may be increased) and color deviation compensation may not be easily performed. Therefore, in such an embodiment where the thickness t2 of the first base film 655 is about 70 μm or more and about 130 μm or less in the thickness direction of the front protection film 650 (or the thickness direction of the window 600), damage to the hard coating layer 640 may be effectively prevented, and deterioration of optical characteristics may be effectively prevented.

In an embodiment, the second antistatic layer 657 may be arranged on the first base film 655. The second antistatic layer 657 may provide antistatic properties to the window 600 or the front protection film 650. However, embodiments are not limited thereto. In an alternative embodiment, for example, at least one selected from the first antistatic layer 653 and the second antistatic layer 657 may be omitted.

In an alternative embodiment, for example, as shown in FIG. 3B, the first antistatic layer 653 may be omitted. In such an embodiment where the first antistatic layer 653 is omitted, the front protection film 650 may include a first adhesive layer 651, a first base film 655, and a second antistatic layer 657. In such an embodiment where the first antistatic layer 653 is omitted, the first adhesive layer 651 may include antistatic components.

In another alternative embodiment, for example, as shown in FIG. 3C, the second antistatic layer 657 may be omitted. In such an embodiment, the front protection film 650 may include a first adhesive layer 651, a first antistatic layer 653, and a first base film 655. In such an embodiment where the second antistatic layer 657 is omitted, the first adhesive layer 651 may include antistatic components.

In another alternative embodiment, as shown in FIG. 3D, the first antistatic layer 653 and the second antistatic layer 657 may be omitted. In such an embodiment, the front protection film 650 may include a first adhesive layer 651 and a first base film 655. In such an embodiment where the first antistatic layer 653 and the second antistatic layer 657 are omitted, the first adhesive layer 651 may include antistatic components.

In an embodiment, a thickness t3 of the front protection film 650 may be about 80 μm or more and about 150 μm or less. If the thickness t3 of the front protection film 650 is less than about 80 μm, the thickness t3 of the front protection film 650 may be so small that antistatic properties may be deteriorated and the hard coating layer 640 may be damaged by external foreign substances or protrusions. On the other hand, if the thickness t3 of the front protection film 650 exceeds about 150 μm, the thickness t3 of the front protection film 650 may be so large that optical characteristics of the display apparatus 1 including the front protection film 650 may be deteriorated (e.g., haze may be increased) and color deviation compensation may not be easily performed.

In an embodiment, a surface resistance (or a sheet resistance) of the front protection film 650 may be in a range of about $10^5$ Ohm per square (Ω/sq) to about $10^{11}$ Ω/sq. In such an embodiment, the surface resistance of the front protection film 650 may be measured using surface resistance measuring devices TREK 152-1 and TREK. In such an embodiment where the surface resistance of the front protection film 650 is in the above-described numerical range, foreign substances may be effectively prevented from being introduced into the display apparatus by static electricity generated during the manufacturing process of the display apparatus or while the display apparatus is used.

In an embodiment, the release force of the front protection film 650 may be about 7 gram-force per inch (g·f/inch) or more and about 23 g·f/inch or less. In such an embodiment, the release force of the front protection film 650 may be measured according to ASTM D 3330 standards. In an embodiment, for example, the release force may be measured at an angle of about 180° and a peeling speed of 300 millimeters per minute (mm/min) at a temperature of about 22° C. to about 24° C. after 30 minutes elapses after the front protection film 650 is attached to a stainless steel sheet SUS 304.

In an embodiment, as shown in FIGS. 2 and 4, the lower structure 10 may be arranged under the window 600. In an embodiment, for example, the lower structure 10 may be attached (or adhered) to a lower portion of the window 600.

In an embodiment, the lower structure 10 may include a display panel 200, a first protection member 110, a fourth adhesive layer 120, a second protection member 130, a plate 140, a fifth adhesive layer 150, a digitizer 160, a cushion layer 170, and a waterproof member 180. The display panel 200 will be described in greater detail with reference to FIG. 5.

In an embodiment, the first protection member 110 may be arranged on the display panel 200. The first protection member 110 may be arranged at an upper portion of the display panel 200 to protect the display panel 200 from external shock. The first protection member 110 may include or be formed of a polymer resin. In an embodiment, for example, the first protection member 110 may include polyethersulfone, polyacrylate, polyetherimide, polyethylene naphthalate, polyethylene terephthalate, polyphenylene sulfide, polyarylate, polyimide, polycarbonate, cellulose acetate propionate, or the like.

However, embodiments are not limited thereto. Alternatively, the first protection member 110 may include or be formed of a material, such as glass, quartz, or the like. In an embodiment, although not shown, an adhesive layer may be further provided between the display panel 200 and the first protection member 110. In such an embodiment, the display panel 200 may have a thickness of about 105 μm in a thickness direction of the display apparatus 1, and the first protection member 110 may have a thickness of about 73 μm in the thickness direction of the display apparatus 1 (or a thickness direction of the lower structure 10).

In an embodiment, the fourth adhesive layer 120 may be arranged on the first protection member 110. The fourth adhesive layer 120 may include a PSA. However, embodiments are not limited thereto. Alternatively, the fourth adhesive layer 120 may also include an OCA. The fourth adhesive layer 120 may have the thickness of about 75 μm in the thickness direction of the display apparatus 1. In an embodiment, as shown in FIG. 2, the window substrate 610 may be arranged on the fourth adhesive layer 120.

In an embodiment, the second protection member 130 may be arranged under the display panel 200. The second protection member 130 may be arranged under the display panel 200 to support the display panel 200 and to protect the display panel 200 from external shock. The second protection member 130 may include or be formed of a polymer resin. In an embodiment, for example, the second protection member 130 may include polyethersulfone, polyacrylate, polyetherimide, polyethylene naphthalate, polyethylene terephthalate, polyphenylene sulfide, polyarylate, polyimide, polycarbonate, cellulose acetate propionate, or the like. However, embodiments are not limited thereto. Alternatively, the second protection member 130 may include or be formed of a material, such as glass, quartz, or the like. Alternatively, the second protection member 130 may also include an inorganic material. The second protection member 130 may have a thickness of about 76 μm in the thickness direction of the display apparatus 1 (or the thickness direction of the lower structure 10).

In an embodiment, the plate 140 may be arranged under the second protection member 130. The plate 140 may be arranged below the display panel to support the display panel 200. In an embodiment, the plate 140 may have various structures depending on whether the display apparatus 1 is folded or foldable and a folding shape of the display apparatus 1. In an embodiment, for example, where the display apparatus 1 is not foldable, the plate 140 may be provided in a shape in which the shape thereof does not vary.

In an embodiment, the plate 140 may include a folding structure 145. The shape or the length of the folding structure 145 may vary when the display apparatus 1 is folded. The folding structure 145 may include a pattern portion with an opening, or may include an uneven shape or a link connected to be rotatable with each other. However, embodiments are not limited thereto.

In an embodiment, the plate 140 may include or be formed of at least one selected from glass, a polymer resin, and a metal. In an embodiment, the plate 140 may include glass and a polymer resin, may include glass and a metal, may include a polymer resin and a metal, or may include all of glass, a polymer resin, and a metal. In an embodiment, the folding structure 145 may include at least one selected from glass, a polymer resin, and a metal. In an embodiment, the folding structure 145 of the plate 140 may include or be formed of a metal material, and the remaining portion than the folding structure 145 of the plate 140 may include or be formed of a non-metal material. However, embodiments are not limited thereto. The plate 140 may have a thickness of about 170 μm in the thickness direction of the display apparatus 1 (or the thickness direction of the lower structure 10).

In an embodiment, a shielding member 155 may be arranged under the folding structure 145. The shielding member 155 may include a PSA, an OCA film, or a thermoplastic polyurethane (TPU). The shielding member 155 may be arranged under the folding structure 145 so that foreign substances may be effectively prevented from being introduced into the folding structure 145 of the plate 140. The shielding member 155 may have a thickness of about 16 μm in the thickness direction of the display apparatus 1 (or the thickness direction of the lower structure 10).

In an embodiment, the fifth adhesive layer 150 may be arranged under the plate 140. The fifth adhesive layer 150 may be provided as a PSA or an OCA. The fifth adhesive layer 150 may have a thickness of about 20 μm in the thickness direction of the display apparatus 1 (or the thickness direction of the lower structure 10).

In an embodiment, the digitizer 160 may be arranged under the fifth adhesive layer 150. The digitizer 160 may include a body layer and/or a pattern layer. The digitizer 160 may detect a signal inputted from an external electronic pen etc. through a pattern layer. In an embodiment, the digitizer 160 may detect the intensity, direction, etc. of a signal input from an electronic pen or the like.

In a case where the digitizer 160 is integrally provided as a single unitary and indivisible part, cracks may occur in the body layer and/or the pattern layer of the digitizer 160 when the display apparatus 1 is folded. In an embodiment, the digitizer 160 may include a first digitizer located at the left based on a virtual folding axis (or from the center) and a second digitizer located at the right of the folding axis. The digitizer 160 may be provided in a separable structure so that cracks may be effectively prevented from occurring in the body layer and/or the pattern layer. The digitizer 160 may be have a thickness of about 202 μm in the thickness direction of the display apparatus 1 (or the thickness direction of the lower structure 10).

In an embodiment, the cushion layer 170 may be arranged under the digitizer 160. The cushion layer 170 may effectively prevent the digitizer 160 arranged on the cushion layer 170 from being damaged by external shock.

In an embodiment, the cushion layer 170 may include a metal and/or a polymer resin. In an embodiment, for example, the cushion layer 170 may include a metal material, such as molybdenum (Mo), aluminum (Al), copper (Cu) and/or titanium (Ti), and/or a polymer resin, such as polyethersulfone, polyacrylate, polyetherimide, polyethylene naphthalate, polyethylene terephthalate, polyphenylene sulfide, polyarylate, polyimide, polycarbonate or cellulose acetate propionate. The cushion layer 170 may have a thickness of about 26 μm in the thickness direction of the display apparatus 1 (or the thickness direction of the lower structure 10).

Although not shown, an electromagnetic wave absorbing layer and/or a heat dissipating layer may be further provided between the digitizer 160 and the cushion layer 170.

In an embodiment, the waterproof member 180 may be arranged under the digitizer 160 and under the cushion layer 170. The waterproof member 180 may include an acryl-based waterproof sheet. The waterproof member 180 disposed under the digitizer 160 may have a thickness of about 173 μm or about 104 μm in the thickness direction of the display apparatus 1 (or the thickness direction of the lower structure 10), and the waterproof member 180 disposed under the cushion layer 170 may have a thickness of about 90 μm.

Although not shown, the display apparatus 1 may be provided with an opening defined through portions of layers that constitute the display apparatus 1. In an embodiment, for example, the opening may be defined in each of the second protection member 130, the plate 140, the fifth adhesive layer 150, and the digitizer 160.

Figure 5:
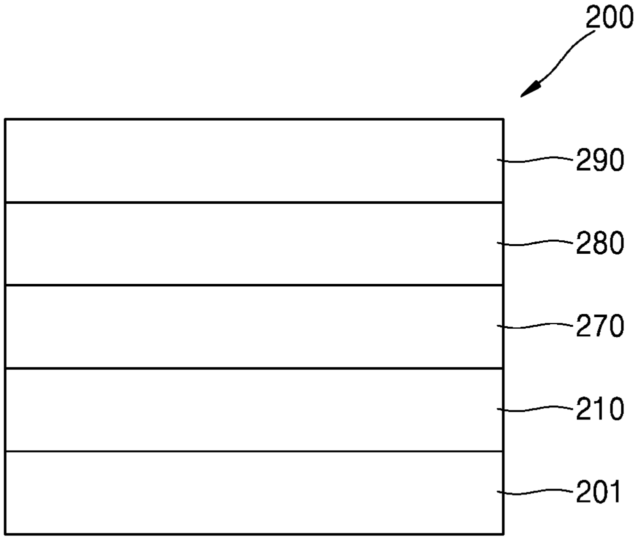
FIG. 5 is a cross-sectional view schematically illustrating a display panel of a display apparatus according to an embodiment.

FIG. 5 is a cross-sectional view schematically illustrating a display panel of a display apparatus according to an embodiment.

Referring to FIG. 5, a display panel 200 may include a substrate 201, a display layer 210, an encapsulation layer 270, an input sensing layer 280, and an optical functional layer 290.

The display layer 210 may include a display element (or light emitting elements) for emitting light to display an image. The display element may include a light-emitting diode, for example, an organic light-emitting diode including an organic light-emitting layer. In an embodiment, the light-emitting diode may be an inorganic light-emitting diode including an inorganic material. The inorganic light-emitting diode may include a PN diode including materials based on an inorganic material semiconductor. When a voltage is applied to a PN junction diode in a forward direction, holes and electrons may be injected, and energy generated by recombination of the holes and electrons may be converted into light energy to emit light of a certain color. The inorganic light-emitting diode described above may have a width of several to several hundreds of micrometers or several to several hundreds of nanometers. In an embodiment, the display layer 210 may include a quantum dot light-emitting diode. In an embodiment, for example, the light-emitting layer of the display layer 210 may include an organic material, or may include an inorganic material, or may include a quantum dot, or may include an organic material and a quantum dot, or may include an inorganic material and a quantum dot.

The encapsulation layer 270 may be arranged on the display layer 210. The encapsulation layer 270 may include an encapsulation substrate or a thin film encapsulation layer. The encapsulation substrate may be provided as glass, and the thin film encapsulation layer may include at least one inorganic film layer and at least one organic film layer. In an embodiment, for example, the thin film encapsulation layer may be provided in a structure in which a first inorganic film layer, an organic layer, and a second inorganic film layer are stacked on each other. The encapsulation layer 270 may effectively prevent oxygen or moisture from penetrating into the display layer 210.

The input sensing layer 280 may be disposed on the encapsulation layer 270. In an embodiment, the input sensing layer 280 may be directly formed on the encapsulation layer 270. Alternatively, an adhesive layer may be between the encapsulation layer 270 and the input sensing layer 280.

The input sensing layer 280 may obtain coordinate information according to an external input, for example, a touch event. The input sensing layer 280 may include a sensing electrode or a touch electrode and a trace line connected to the sensing electrode. The input sensing layer 280 may sense an external input by using a mutual capacitance method or/and a self-capacitance method.

The optical functional layer 290 may be disposed on the input sensing layer 280. The optical functional layer 290 may include an antireflective layer. The antireflective layer may reduce the reflectivity of light (external light) incident toward the display panel 200 from the outside through the window (see 600 of FIG. 1). The antireflective layer may include a retarder and a polarizer. In an embodiment, the antireflective layer may include a black matrix and color filters. The color filters may be arranged considering color of light emitted from each of light-emitting devices of the display layer 210.

Figure 6:
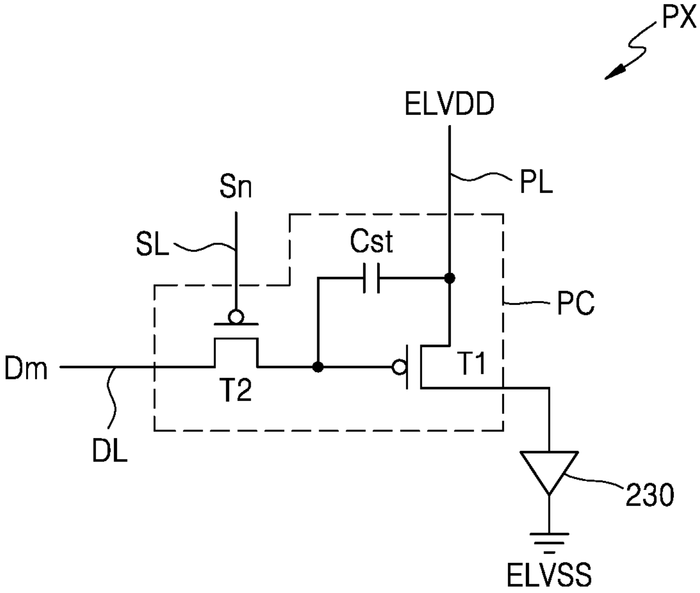
FIG. 6 is an equivalent circuit diagram of a pixel of a display apparatus according to an embodiment.

FIG. 6 is an equivalent circuit diagram of a pixel of a display apparatus according to an embodiment.

In an embodiment, the pixel PX may include a pixel circuit PC connected to a scan line SL and a data line DL, and a light-emitting device 230 connected to the pixel circuit PC. The light-emitting device 230 may include a pixel electrode (see 231 of FIG. 7), a light-emitting layer (see 233 of FIG. 7), and an opposite electrode (see 235 of FIG. 7), as will be described later in FIG. 7. The opposite electrode 235 of the light-emitting device 230 may be a common electrode to which a second driving voltage ELVSS is applied.

The pixel circuit PC may include a first transistor T1, a second transistor T2, and a storage capacitor Cst. The first transistor T1 may be a driving transistor in which a magnitude of a drain current is determined in response to a gate-source voltage, and the second transistor T2 may be a switching transistor that is turned on/off in response to the gate-source voltage, substantially, a gate voltage. The first transistor T1 and the second transistor T2 may be formed as thin-film transistors.

The storage capacitor Cst may be connected between a power supply line PL and a gate of the first transistor T1. The storage capacitor Cst may have an upper electrode connected to the power supply line PL, and a lower electrode connected to the gate of the first transistor T1. The storage capacitor Cst may store a voltage that corresponds to a difference between a voltage transmitted from the second transistor T2 and a first driving voltage ELVDD supplied to the power supply line PL.

The first transistor T1 may control the magnitude of a current flowing from the power supply line PL to the light-emitting device 230 in response to the gate-source voltage. The light-emitting device 230 may emit light having certain brightness corresponding to the driving current. The first transistor T1 may have a gate connected to the lower electrode of the storage capacitor Cst, a drain connected to the power supply line PL, and a source connected to the light-emitting device 230.

The second transistor T2 may transmit a data voltage Dm to the gate of the first transistor T1 in response to a scan signal Sn. The second transistor T2 may have a gate connected to the scan line SL, a drain connected to the data line DL, and a source connected to the gate of the first transistor T1.

In an embodiment, as shown in FIG. 6, the pixel circuit PC may include two transistors and a single storage capacitor. However, embodiments are not limited thereto. In an alternative embodiment, for example, the pixel circuit PC may include three or more transistors and/or two or more storage capacitors. Alternatively, the pixel circuit PC may include seven transistors and a single storage capacitor. Alternatively, the pixel circuit PC may be variously modified like that the pixel circuit PC may include nine transistors and two storage capacitors.

Figure 7:
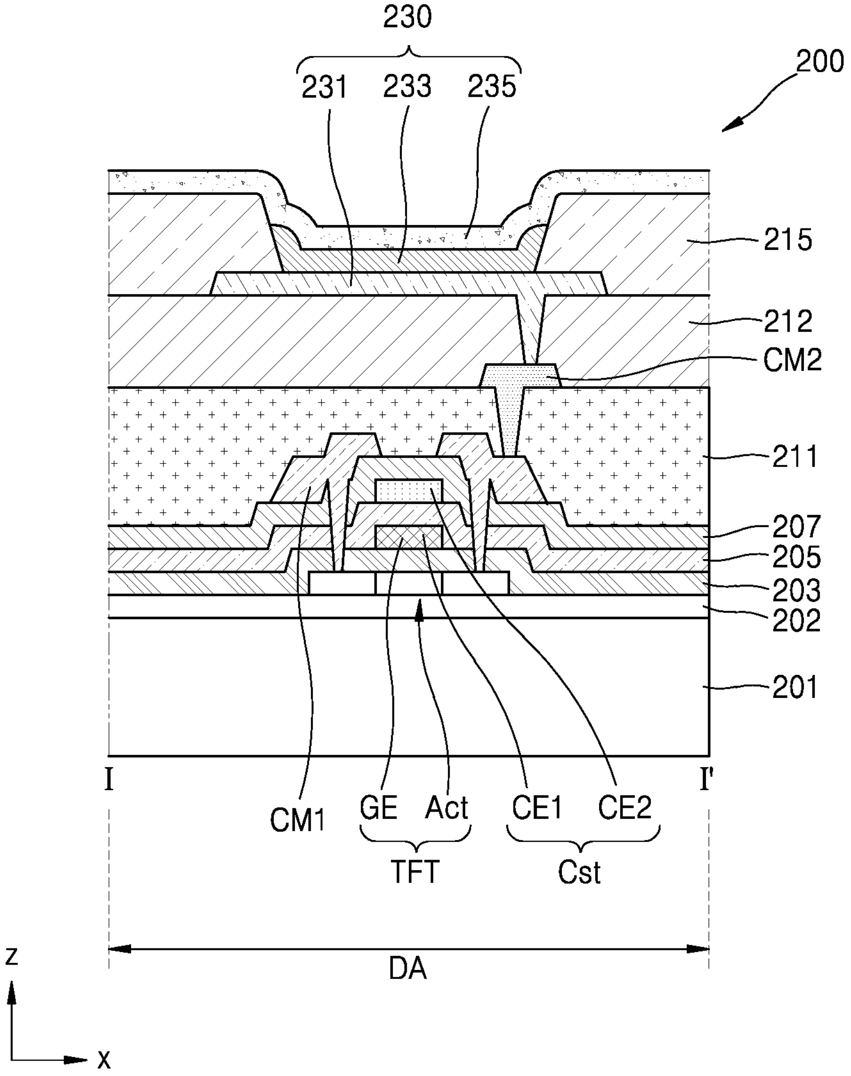
FIG. 7 is a cross-sectional view schematically illustrating a display panel of a display apparatus according to an embodiment.

FIG. 7 is a cross-sectional view schematically illustrating a display panel of a display apparatus according to an embodiment.

Referring to FIG. 7, a substrate 201 may include or be formed of glass or a polymer resin. In an embodiment, for example, when the substrate 201 is formed of a polymer resin, the substrate 201 may include polyethersulfone, polyacrylate, polyetherimide, polyethylene naphthalate, polyethylene terephthalate, polyphenylene sulfide, polyarylate, polyimide, polycarbonate, cellulose acetate propionate, or the like. Although not shown, the substrate 201 may be provided in a structure in which an organic material/inorganic material/organic material/inorganic material are sequentially stacked on each other.

A buffer layer 202 may be arranged on the substrate 201. The buffer layer 202 may reduce or block penetration of foreign substances, moisture or outside air from a lower portion of the substrate 201. The buffer layer 202 may include an inorganic material such as silicon oxide, silicon oxynitride, or silicon nitride, and may be provided in a single layer or multi-layered structure, each layer therein including at least one selected from the above-described materials.

A thin-film transistor TFT including a semiconductor pattern Act and a gate electrode GE may be arranged on the buffer layer 202. The semiconductor pattern Act may be arranged on the buffer layer 202. The semiconductor pattern Act may include a silicon semiconductor. In an embodiment, the semiconductor pattern Act may include polysilicon. However, embodiments are not limited thereto. Alternatively, the semiconductor pattern Act may also include amorphous silicon. Alternatively, the semiconductor pattern Act may include an oxide semiconductor. The oxide semiconductor may include a crystalline or amorphous oxide semiconductor.

FIG. 7 illustrates a portion of the semiconductor pattern Act, and a semiconductor pattern may be further disposed in another region of the pixel PX. In an embodiment, the semiconductor pattern Act may include a high doping region and a low doping region. The high doping region and the low doping region may be doped with an N-type dopant or a P-type dopant. A P-type transistor may include a high doping region and a low doping region doped with the P-type dopant. In this case, the content of the P-type dopant in the high doping region may be greater than the content of the P-type dopant in the low doping region.

Although not shown, the semiconductor pattern Act may include a source, an active, and a drain. The source and the drain may be spaced apart from each other with the active therebetween.

A first insulating layer 203 may be arranged on the buffer layer 202. The first insulating layer 203 may cover at least a portion of the semiconductor pattern Act. In an embodiment, the first insulating layer 203 may include an inorganic material such as silicon oxide, silicon oxynitride, or silicon nitride, and may be provided in a single layer or multi-layered structure, each layer therein including at least one selected from the above-described materials.

The gate electrode GE of the TFT may be arranged on the first insulating layer 203. The gate electrode GE may be a portion of a metal pattern. At least a portion of the gate electrode GE may overlap the semiconductor pattern Act arranged under the gate electrode GE. In an embodiment, for example, the gate electrode GE may overlap the active disposed thereunder. The gate electrode GE may include a conductive material having a low resistance, such as Mo, Al, Cu and/or Ti, and may be provided in a single layer or multi-layered structure, each layer therein including at least one selected from the above-described materials.

A second insulating layer 205 may be arranged on the first insulating layer 203. The second insulating layer 205 may cover at least a portion of the gate electrode GE disposed on the first insulating layer 203. The second insulating layer 205 may include an inorganic material such as silicon oxide, silicon oxynitride, or silicon nitride, and may be provided in a single layer or multi-layered structure, each layer therein including at least one selected from the above-described materials.

An upper electrode CE2 may be arranged on the second insulating layer 205. At least a portion of the upper electrode CE2 may at least partially overlap the lower electrode CE1 disposed thereunder. The upper electrode CE2 may be a portion of a metal pattern or a portion of a doped semiconductor pattern. The lower electrode CE1 and the upper electrode CE2 that overlap each other with the second insulating layer 205 therebetween may constitute the storage capacitor Cst. In an embodiment, the gate electrode GE and the lower electrode CE1 may be provided integrally or integrally formed as a single unitary and indivisible part. However, embodiments are not limited thereto. Alternatively, the gate electrode GE and the lower electrode CE1 may be spaced apart from each other.

A third insulating layer 207 may be arranged on the second insulating layer 205. The third insulating layer 207 may cover the upper electrode CE2 disposed on the second insulating layer 205. The third insulating layer 207 may include an inorganic material such as silicon oxide, silicon oxynitride, or silicon nitride, and may be provided in a single layer or multi-layered structure, each layer therein including at least one selected from the above-described materials. In an embodiment, the third insulating layer 207 may include a plurality of silicon oxide layers and silicon nitride layers alternately stacked one on another.

A first connection electrode CM1 may be arranged on the third insulating layer 207. The first connection electrode CM1 may be electrically connected to the semiconductor pattern Act through each of contact holes defined in the first insulating layer 203 to the third insulating layer 207. However, embodiments are not limited thereto. The first connection electrode CM1 may include a conductive material having a low resistance, such as Mo, Al, Cu and/or Ti, and may be provided in a single layer or multi-layered structure, each layer therein including at least one selected from the above-described material. In an embodiment, for example, the first connection electrode CM1 may be provided in a multi-layered structure of titanium/aluminum/titanium.

At least one organic insulating layer may be arranged on the third insulating layer 207. In an embodiment, a first organic insulating layer 211 and a second organic insulating layer 212 may be arranged on the third insulating layer 207. However, embodiments are not limited thereto. Alternatively, a single organic insulating layer may be arranged on the third insulating layer 207 or three or more organic insulating layers may be arranged on the third insulating layer 207. In an embodiment, the first organic insulating layer 211 and the second organic insulating layer 212 may be single-layer polyimide-based resin layers. However, embodiments are not limited thereto. In an alternative embodiment, tach of the first organic insulating layer 211 and the second organic insulating layer 212 may include at least one selected from an acryl-based resin, a methacryl-based resin, polyisoprene, a vinyl resin, an epoxy-based resin, a urethane-based rein, a cellulose-based resin, a siloxane-based resin, a polyamide-based resin, and a perylene-based resin.

A second connection electrode CM2 may be arranged on the first organic insulating layer 211. The second connection electrode CM2 may be electrically connected to the first connection electrode CM1 through the contact hole defined in the first organic insulating layer 211. The second connection electrode CM2 may include a conductive material having a low resistance, such as Mo, Al, Cu and/or Ti, and may be provided in a single layer or multi-layered structure, each layer therein including at least one selected from the above-described materials. In an embodiment, for example, the second connection electrode CM2 may be provided in a multi-layered structure of titanium/aluminum/titanium.

A light-emitting device 230 including the pixel electrode 231, the light-emitting layer 233, and the opposite electrode 235 may be arranged on the second organic insulating layer 212. In an embodiment, for example, the light-emitting device 230 may be an organic light-emitting diode. The pixel electrode 231 may be arranged on the second organic insulating layer 212. The pixel electrode 231 may be electrically connected to the second connection electrode CM2 through the contact hole defined in the second organic insulating layer 212. The pixel electrode 231 may include a conductive oxide, such as indium tin oxide (ITO), indium zinc oxide (IZO), zinc oxide (ZnO), indium oxide ($In_2O_3$), indium gallium oxide (IGO) or aluminum zinc oxide (AZO). In an embodiment, the pixel electrode 231 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. In an embodiment, the pixel electrode 231 may further include a layer including or formed of ITO, IZO, ZnO or $In_2O_3$ on/under the above-described reflective layer. In an embodiment, for example, the pixel electrode 231 may have a multi-layered structure of ITO/Ag/ITO.

A pixel defining layer 215 in which an opening exposing at least a portion of the pixel electrode 231 is defined may be disposed on the pixel electrode 231. The opening defined in the pixel defining layer 215 may define an emission region of light emitted from the light-emitting device 230. In an embodiment, for example, the width of the opening defined in the pixel defining layer 215 may correspond to a width of the emission region.

The pixel defining layer 215 may include an organic insulating material. Alternatively, the pixel defining layer 215 may include an inorganic insulating material, such as silicon nitride or silicon oxynitride, or silicon oxide. Alternatively, the pixel defining layer 215 may include an organic insulating material and an inorganic insulating material. In an embodiment, the pixel defining layer 215 may include a light blocking material and may be provided as black. The light blocking material may include a resin or paste including carbon black, carbon nanotubes, a black dye, metal particles, such as nickel, aluminum, molybdenum, and an alloy thereof, metal oxide particles (e.g., chromium oxide) or metal nitride particles (e.g., chromium nitride), or the like. In an embodiment where the pixel defining layer 215 includes the light blocking material, external light reflection by metal structures disposed under the pixel defining layer 215 may be reduced.

Although not shown, a spacer may be disposed on the pixel defining layer 215. The spacer may include an organic insulating material, such as polyimide. Alternatively, the spacer may include an organic insulating material, such as silicon oxide, silicon nitride, silicon oxynitride, or may include an organic insulating material and an inorganic insulating material.

In an embodiment, the spacer may include a same material as the pixel defining layer 215. In such an embodiment, the pixel defining layer 215 and the spacer may be formed together in a mask process using a halftone mask etc. In an alternative embodiment, the spacer and the pixel defining layer 215 may include different materials from each other.

A light-emitting layer 233 may be arranged on the pixel electrode 231. Although not shown, a first functional layer and a second functional layer may be arranged under and on the light-emitting layer 233. The first functional layer and the second functional layer may be collectively referred to as an organic functional layer.

The light-emitting layer 233 may be arranged in the opening of the pixel defining layer 215. The light-emitting layer 233 may include a polymer organic material or a small molecular organic material that emits light of a certain color.

The first functional layer may be between the pixel electrode 231 and the light-emitting layer 233, and the second functional layer may be between the light-emitting layer 233 and the opposite electrode 235. However, embodiments are not limited thereto. At least one selected from the first functional layer and the second functional layer may be omitted.

The first functional layer may include, for example, a hole transport layer (HTL), or may include an HTL and a hole injection layer (HIL). The second functional layer may include an electron transport layer (ETL) and/or an electron injection layer (EIL). The first functional layer and/or the second functional layer may be a common layer formed to entirely cover the substrate 201.

The opposite electrode 235 may include a conductive material having a small work function. In an embodiment, for example, the opposite electrode 235 may include a (semi-)transparent layer including Ag, Mg, Al, Pt, Pd, Au, Ni, Nd, Ir, Cr, lithium (Li), calcium (Ca), or an alloy thereof. Alternatively, the opposite electrode 235 may further include a layer such as ITO, IZO, ZnO, or $In_2O_3$ on the (semi-)transparent layer including the above-described material.

Although not shown, a capping layer may further be disposed on the opposite electrode 235. The capping layer may include lithium fluoride (LiF), an inorganic material, or/and an organic material.

FIGS. 8 through 11 are cross-sectional views schematically illustrating a method of manufacturing a display apparatus according to an embodiment.

Hereinafter, the method of manufacturing a display apparatus will be sequentially described with reference to FIGS. 8 through 11.

Referring to FIGS. 8 through 11, the method of manufacturing the display apparatus according to an embodiment may include preparing a window 600 including a rear protection film 601, a window substrate 610, a front protection film 650, and a carrier protection film 670, removing the rear protection film 601 and attaching a lower structure 10 to the window substrate 610, and removing the carrier protection film 670.

Figure 8:
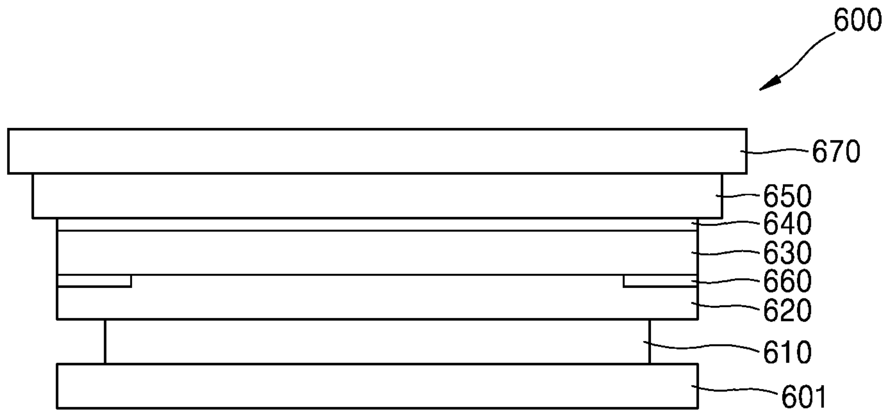
FIGS. 8 through 11 are cross-sectional views schematically illustrating a method of manufacturing a display apparatus according to an embodiment.
Figure 9:
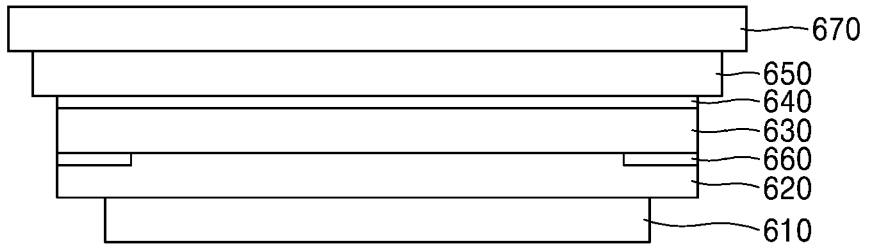
Figure 10:
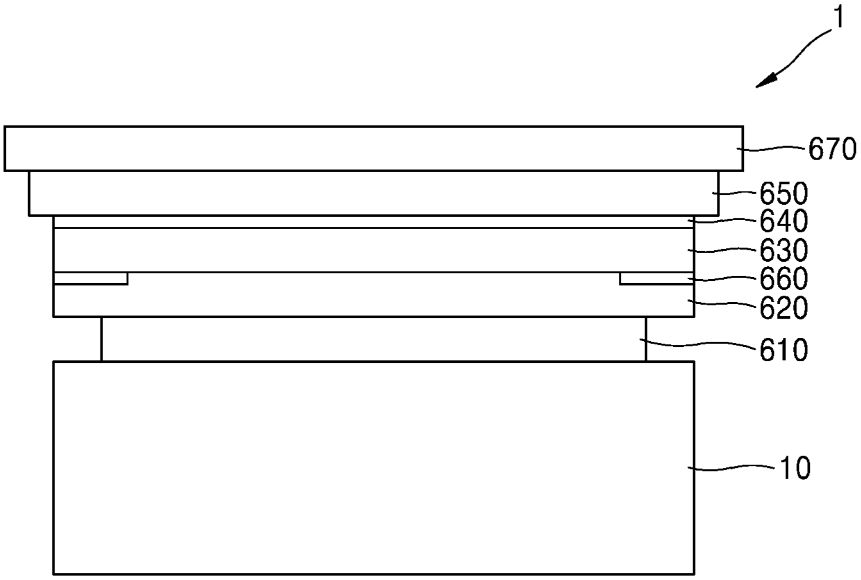

Referring to FIG. 8, the window 600 may include the rear protection film 601, the window substrate 610, the front protection film 650, and the carrier protection film 670. In addition, the window 600 may further include a second adhesive layer 620, a film layer 630, and a hard coating layer 640, which are between the window substrate 610 and the front protection film 650.

In an embodiment, the window substrate 610 may be located on the rear protection film 601. The window substrate 610 may include a material, such as glass, quartz, or the like. In an embodiment, for example, the window substrate 610 may include or be formed of ultra-thin glass (UTG™).

The second adhesive layer 620 may be located on the window substrate 610. In an embodiment, the second adhesive layer 620 may include a PSA. However, embodiments are not limited thereto. Alternatively, the second adhesive layer 620 may include an OCA.

The film layer 630 may be located on the second adhesive layer 620. The film layer 630 may include a polymer resin, such as polyethersulfone, polyacrylate, polyetherimide, polyethylene naphthalate, polyethylene terephthalate, polyphenylene sulfide, polyarylate, polyimide, polycarbonate, cellulose acetate propionate, or the like.

The hard coating layer 640 may be located on the film layer 630. in an embodiment, the hard coating layer 640 may include or be formed of an organic material such as a polymer resin. However, embodiments are not limited thereto. Alternatively, the hard coating layer 640 may include or be formed of an inorganic material.

The front protection film 650 may be located on the hard coating layer 640. As described above in FIG. 3A, the front protection film 650 may include a first adhesive layer (see 651 of FIG. 3A), a first antistatic layer (see 653 of FIG. 3A), a first base film (see 655 of FIG. 3A), and a second antistatic layer (see 657 of FIG. 3A). In an embodiment, for example, at least one selected from the first antistatic layer 653 and the second antistatic layer 657 may be omitted. Alternatively, although not shown, the front protection film 650 may further include a first release film disposed under the first adhesive layer 651. The first adhesive layer 651, the first antistatic layer 653, the first base film 655, and the second antistatic layer 657 may have the material and thickness described above in FIG. 3A.

FIGS. 12A through 12D are cross-sectional views schematically illustrating a carrier protection film of a display apparatus according to an embodiment.

Figure 12A:
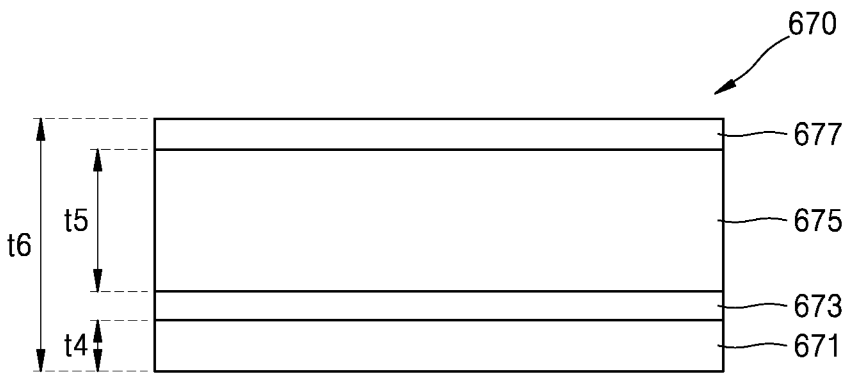
FIGS. 12A through 12D are cross-sectional views schematically illustrating a carrier protection film of a display apparatus according to an embodiment.

Referring to FIGS. 8 and 12A, the carrier protection film 670 may be located on the front protection film 650. The carrier protection film 670 may include a third adhesive layer 671, a third antistatic layer 673, a second base film 675, and a fourth antistatic layer 677. Alternatively, although not shown, the carrier protection film 670 may further include a second release film disposed under the third adhesive layer 671.

In an embodiment, the third adhesive layer 671 may include a PSA. In an embodiment, for example, the third adhesive layer 671 may be an acryl-based PSA. However, embodiments are not limited thereto. Alternatively, the third adhesive layer 671 may include an OCA. The third adhesive layer 671 may have a thickness t1 of about 10 μm or more and about 20 μm or less in the thickness direction of the carrier protection film 670 (e.g., the thickness direction of the window 600). If a thickness t4 of the third adhesive layer 671 is less than about 10 μm, an adhesive force is so small that the carrier protection film 670 may be easily peeled from the front protection film 650. On the other hand, if the thickness t4 of the third adhesive layer 671 exceeds about 20 μm, the adhesive force of the carrier protection film 670 may be so large that the front protection film 650 may be together removed when the carrier protection film 670 is removed, or bubbles may be generated, as will be described below. Thus, in such an embodiment where the third adhesive layer 671 has the thickness t4 of about 10 μm or more and about 20 μm or less, the carrier protection film 670 may have a desired degree of release force.

In an embodiment, the third antistatic layer 673 may be arranged on the third adhesive layer 671. The third antistatic layer 673 may provide antistatic properties to the window 600 or the carrier protection film 670.

In an embodiment, the second base film 675 may be arranged on the third antistatic layer 673. The second base film 675 may include a polymer resin, such as polyethersulfone, polyacrylate, polyetherimide, polyethylene naphthalate, polyethylene terephthalate, polyphenylene sulfide, polyarylate, polyimide, polycarbonate, cellulose acetate propionate, or the like. However, embodiments are not limited thereto. In an alternative embodiment, for example, the second base film 675 may include or be formed of a material, such as glass, quartz, or the like.

In an embodiment, a thickness t5 of the second base film 675 may be about 35 μm or more and about 65 μm or less in a thickness direction of the carrier protection film 670 (or the thickness direction of the window 600). If a thickness t5 of the second base film 675 is less than about 35 μm, the front protection film 650 may be damaged by external foreign substances or protrusions, and the release force of the carrier protection film 670 may be so large that the front protection film 650 may be removed together when the carrier protection film 670 is removed. On the other hand, if the thickness t5 of the second base film 675 exceeds about 65 μm, the carrier protection film 670 may be easily peeled from the front protection film 650, and in this case, bubbles may be generated. Thus, in such an embodiment where the thickness t5 of the second base film 675 is about 35 μm or more and about 65 μm or less in the thickness direction of the carrier protection film 670 (or the thickness direction of the window 600), the front protection film 650 may be effectively prevented from being damaged, and the carrier protection film 670 may be easily removed from the front protection film 650.

In an embodiment, the fourth antistatic layer 677 may be arranged on the second base film 675. The fourth antistatic layer 677 may provide antistatic properties to the window 600 or the carrier protection film 670. However, embodiments are not limited thereto. In an alternative embodiment, for example, at least one selected from the third antistatic layer 673 and the fourth antistatic layer 677 may be omitted.

Figure 12B:
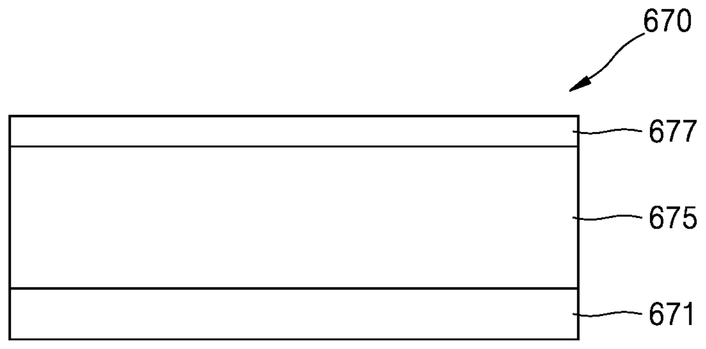

In an embodiment, for example, as shown in FIG. 12B, the third antistatic layer 673 may be omitted. In such an embodiment where the third antistatic layer 673 is omitted, the carrier protection film 670 may include a third adhesive layer 671, a second base film 675, and a fourth antistatic layer 677. In such an embodiment where the third antistatic layer 673 is omitted, the third adhesive layer 671 may include antistatic components.

Figure 12C:
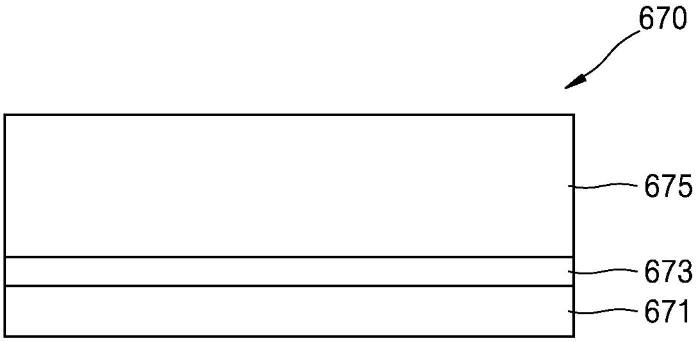

Alternatively, as shown in FIG. 12C, the fourth antistatic layer 677 may be omitted. In such an embodiment, the carrier protection film 670 may include a third adhesive layer 671, a third antistatic layer 673, and a second base film 675. In such an embodiment where the fourth antistatic layer 677 is omitted, the third adhesive layer 671 may include antistatic components.

Figure 12D:
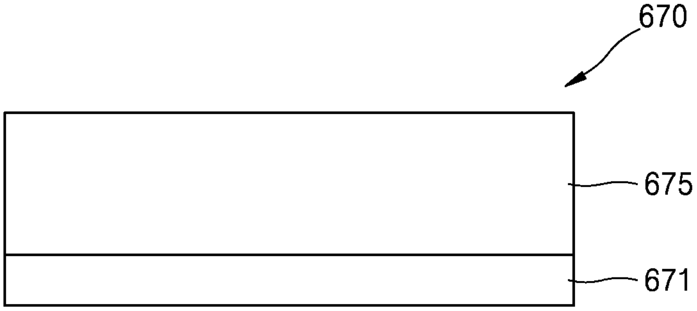

Alternatively, as shown in FIG. 12D, the third antistatic layer 673 and the fourth antistatic layer 677 may be omitted. In such an embodiment, the carrier protection film 670 may include a third adhesive layer 671 and a second base film

675. In such an embodiment where the third antistatic layer 673 and the fourth antistatic layer 677 are omitted, the third adhesive layer 671 may include antistatic components.

In an embodiment, a thickness t6 of the carrier protection film 670 may be about 80 μm or more and about 150 μm or less. If the thickness t6 of the carrier protection film 670 is less than about 80 μm, the thickness t6 of the carrier protection film 670 may be so small that antistatic properties may be deteriorated and the front protection film 650 may be damaged by external foreign substances or protrusions. On the other hand, if the thickness t6 of the carrier protection film 670 exceeds 150 μm, the thickness t6 of the carrier protection film 670 may be so large that the carrier protection film 670 may be easily peeled from the front protection film 650, and in this case, bubbles may be generated. Thus, in such an embodiment, the thickness t6 of the carrier protection film 670 is about 80 μm or more and about 150 μm or less so that the front protection film 650 may be effectively prevented from being damaged and the carrier protection film 670 may have a desired degree of the release force.

In an embodiment, the surface resistance of the carrier protection film 670 may be about $10^5$ Ω/sq to about $10^{11}$ Ω/sq. In such an embodiment, the surface resistance of the carrier protection film 670 may be measured using surface resistance measuring devices TREK 152-1 and TREK. In such an embodiment where the surface resistance of the carrier protection film 670 satisfies the above-described numerical range, foreign substances may be effectively prevented from being introduced into the display apparatus by static electricity generated during the manufacturing process of the display apparatus.

In an embodiment, the release force of the carrier protection film 670 may be smaller than the release force of the front protection film 650. In an embodiment, the release force of the carrier protection film 670 may be about 5 g·f/inch or more and about 15 g·f/inch or less. In an embodiment, for example, the release force of the carrier protection film 670 from the front protection film 650 may be about 5 g·f/inch or more and about 15 g·f/inch or less. In such an embodiment, the peeling speed of the carrier protection film 670 may be 2400 mm/min. if the release force of the carrier protection film 670 is less than about 5 g·f/inch, the carrier protection film 670 may be very easily peeled from the front protection film 650, that is, the carrier protection film 670 may be naturally peeled from the front protection film 650. On the other hand, if the release force of the carrier protection film 670 exceeds about 15 g·f/inch, the release force of the carrier protection film 670 may be so large that the front protection film 650 may be removed together while the carrier protection film 670 is removed. Thus, in such an embodiment where the release force of the carrier protection film 670 is about 5 g·f/inch or more and about 15 g·f/inch or less, the carrier protection film 670 may not be naturally peeled from the front protection film 650 and the front protection film 650 may be effectively prevented from being removed together while the carrier protection film 670 is removed.

In an embodiment, the release force of the front protection film 650 may be about 12 g·f/inch or more and about 30 g·f/inch or less. In detail, the release force of the front protection film 650 from the hard coating layer 640 may be about 12 g·f/inch or more and about 30 g·f/inch or less. In this case, the peeling speed of the front protection film 650 may be 2400 mm/min. If the release force of the front protection film 650 is less than about 12 g·f/inch, the front protection film 650 may be very easily peeled from the hard coating layer 640, that is, the front protection film 650 may be naturally peeled from the hard coating layer 640. On the other hand, if the release force of the front protection film 650 exceeds about 30 g·f/inch, the release force of the front protection film 650 may be so large that the window substrate 610 or the second adhesive layer 620 may be peeled. Thus, in such an embodiment where the release force of the front protection film 650 is about 12 g·f/inch or more and about 30 g·f/inch or less, the front protection film 650 may not be naturally peeled from the hard coating layer 640 and may have a desired degree of release force.

Referring back to FIGS. 9 and 10, the rear protection film 601 located under the window substrate 610 may be removed, and the lower structure 10 may be attached to the window substrate 610. The rear protection film 601 located under the window substrate 610 may be removed, and a lower portion of the window substrate 610 may be exposed. Subsequently, the lower structure 10 described above in FIG. 4 may be attached to the lower portion of the window substrate 610. In an embodiment, for example, the window 600 and the lower structure 10 may be combined with each other.

Figure 11:
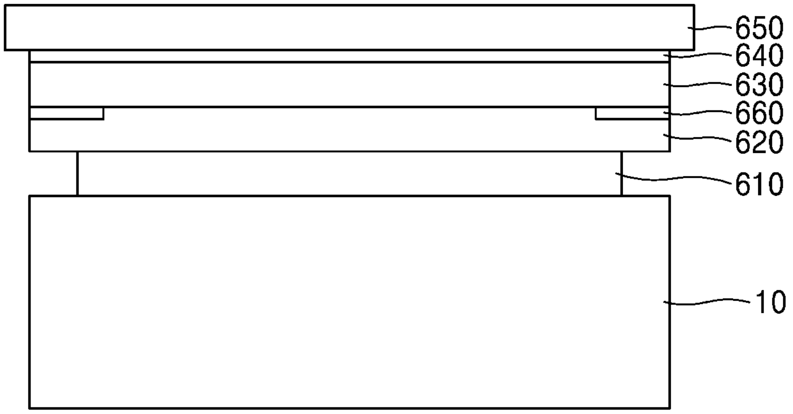

Subsequently, referring to FIG. 11, the carrier protection film 670 located on the front protection film 650 may be removed. Because the carrier protection film 670 located on the front protection film 650 is removed, the surface of the front protection film 650 may be exposed to the outside.

Subsequently, although not shown, after the carrier protection film 670 located on the front protection film 650 is removed, a process such as color deviation compensation may be performed.

In a case where the window 600 has a structure including only the front protection film 650, the front protection film 650 may be removed during the manufacturing process of the display apparatus, and a cover film is attached (or combined) again after color deviation compensation is performed. However, in this case, when the front protection film 650 is removed, the surface of the hard coating layer 640 may be exposed to the outside so that the surface of the hard coating layer 640 may be damaged by a worker or a falling object. In this case, for example, the surface of the hard coating layer 640 may be pressurized, or scratch may be generated, or the surface of the hard coating layer 640 may be damaged by foreign substances.

In an embodiment of the invention, where the window 600 is provided in a structure including the front protection film 650 and the carrier protection film 670, the front protection film 650 is not removed during the manufacturing process of the display apparatus, and thus, the surface of the hard coating layer 640 may not be exposed to the outside during the manufacturing process of the display apparatus. Thus, the surface of the hard coating layer 640 may be effectively prevented from being damaged during the manufacturing process of the display apparatus, and the defect rate of the manufacturing process of the display apparatus may be reduced.

In such an embodiment, the window 600 has a structure including the front protection film 650 and the carrier protection film 670 so that a process of attaching a cover film in the middle of the manufacturing process of the display apparatus may be omitted and thus the production efficiency of the display apparatus may be enhanced and the material cost of the manufacturing process of the display apparatus may be reduced. In such an embodiment, when the window 600 is manufactured, the window 600 may be provided in a structure including the front protection film 650 and the carrier protection film 670 through roll combination in advance so that the production efficiency of the display apparatus may be enhanced, and the material cost of the manufacturing process of the display apparatus may be reduced.

As described above, according to an embodiment, a display apparatus, in which the damage to the surface of layers of the window other than the protection film may be effectively prevented, and a method of manufacturing the display apparatus are provided.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A method of manufacturing a display apparatus, the method comprising:

preparing a window, wherein the window includes a rear protection film, a window substrate, a front protection film, and a carrier protection film;

removing the rear protection film and attaching a lower structure of the display apparatus to the window substrate; and removing the carrier protection film.

2. The method of claim 1, wherein the front protection film comprises a first adhesive layer and a first base film.

3. The method of claim 2, wherein the front protection film further comprises at least one selected from a first antistatic layer and a second antistatic layer.

4. The method of claim 2, wherein a thickness of the first base film is in a range of about 70 μm to about 130 μm.

5. The method of claim 2, wherein a release force of the front protection film is in a range of about 12 g·f/inch to about 30 g·f/inch.

6. The method of claim 2, wherein a surface resistance of the front protection film is in a range of about 105 Ω/sq to about $10^{11}$ Ω/sq.

7. The method of claim 2, wherein the window further comprises a second adhesive layer, a film layer, and a hard coating layer, which are arranged between the window substrate and the front protection film.

8. The method of claim 7, wherein the first adhesive layer is attached to the hard coating layer.

9. The method of claim 1, wherein the carrier protection film comprises a third adhesive layer and a second base film.

10. The method of claim 9, wherein the carrier protection film further comprises at least one selected from a third antistatic layer and a fourth antistatic layer.

11. The method of claim 9, wherein a thickness of the second base film is in a range of about 35 μm to 65 μm.

12. The method of claim 9, wherein a thickness of the third adhesive layer is in a range of about 10 μm to about 20 μm.

13. The method of claim 9, wherein a release force of the carrier protection film is in a range of about 5 g·f/inch to about 15 g·f/inch.

14. The method of claim 9, wherein a surface resistance of the carrier protection film is in a range of about $10^5$ Ω/sq to about $10^{11}$ Ω/sq.

* * * * *